United States Patent [19]

Matsushita et al.

[11] Patent Number: 5,058,526

[45] Date of Patent: Oct. 22, 1991

[54] VERTICAL LOAD-LOCK REDUCED-PRESSURE TYPE CHEMICAL VAPOR DEPOSITION APPARATUS

[75] Inventors: Yoshinari Matsushita; Kenji Fukumoto, both of Hirakata; Satoshi Takeda, Arai, all of Japan

[73] Assignee: Matsushita Electric Industrial Co., Ltd., Kadoma, Japan

[21] Appl. No.: 318,315

[22] Filed: Mar. 3, 1989

[30] Foreign Application Priority Data

Mar. 4, 1988 [JP] Japan .................. 63-51923

[51] Int. Cl.⁵ .............................................. C23C 16/00
[52] U.S. Cl. .................................. 118/715; 118/719; 414/217; 414/331
[58] Field of Search ............... 118/715, 719, 725, 729; 414/217, 331, 417

[56] References Cited

U.S. PATENT DOCUMENTS

| | | | |
|---|---|---|---|
| 4,542,712 | 9/1985 | Sato et al. .................. | 414/217 |
| 4,640,223 | 2/1987 | Dozier ....................... | 118/719 |
| 4,666,734 | 5/1987 | Kamiya et al. ............. | 118/719 |
| 4,770,590 | 9/1988 | Hugues et al. .............. | 414/331 |

FOREIGN PATENT DOCUMENTS

| | | | |
|---|---|---|---|
| 60-221572 | 11/1985 | Japan ....................... | 118/719 |
| 62-93379 | 4/1987 | Japan ....................... | 118/719 |
| 63-109174 | 5/1988 | Japan ....................... | 118/719 |

*Primary Examiner*—Norman Morgenstern
*Assistant Examiner*—Terry J. Owens
*Attorney, Agent, or Firm*—Cushman, Darby & Cushman

[57] ABSTRACT

A CVD apparatus having a single loading-unloading chamber that serves as a loading chamber in the left and center parts and as an unloading chamber in the right and center parts. Alternately, wafers provisionally stored in cassettes are put into and taken from an auxiliary chamber connected at the center part. The loading-unloading chamber has a sliding bed for slidingly transferring two cassettes, each used for temporarily carrying a plurality of wafers for loading from a load cassette table through the loading cassette to a reaction chamber and for unloading from the reaction chamber through an unloading cassette to an unloading cassette table.

12 Claims, 7 Drawing Sheets

VERTICAL LOAD-LOCK REDUCED-PRESSURE TYPE CHEMICAL VAPOR DEPOSITION APPARATUS

FIELD OF THE INVENTION AND RELATED ART STATEMENT

1. Field of the Invention

The present invention relates to a chemical vapor deposition apparatus to be used in chemical vapor deposition (CVD) process employed in manufacturing semiconductor devices or electronic components, especially to the CVD apparatus of the vertical load-lock reduced-pressure type.

2. Description of the Related Art

In semiconductor manufacturing, for instance, accompanied by recent trends toward high integration and microscopic configuration of the semiconductor devices, increases in wafer diameter to larger sizes up to 5 inches, 6 inches, and even 8 inches are continuously attempted. It is well-known that, in recent years, polycrystalline silicon film, silicon nitride film or silicon oxide film, all made by a chemical vapor deposition (CVD) method, have been performing an important role as conductive films, or insulating films for the semiconductors and small electronic components. Especially in batch type CVD apparatus using a diffusion furnace having a high through-put, in order to correspond to increases in wafer diameter and automation of the CVD manufacturing process, apparatus changes from horizontal type to vertical type, and furthermore, load-lock configuration is adopted for prevention of thermal oxidation of silicon wafers by oxygen in the air before CVD processing and to decrease undesirable growth of flakes and dust on the inside wall of the reaction chamber.

Conventional CVD apparatus has been disclosed, for instance, in the gazette of Japanese unexamined published patent application (Tokkai)Sho 60-200520, and the copending U.S. Ser. No. 07-268929 (the invention is not yet disclosed in Tokkai, gazette). In these documents the CVD apparatus comprises a vertical reaction chamber, including a boat holder containing a boat which holds a number of semiconductor wafers or substrates and is mounted on an elevator, a reaction gas injecting port connected to a reaction gas source, an evacuation port connected to a vacuum pump and a heater for heating the reaction chamber and the wafers therein, and also, a loading chamber which is connected to the reaction chamber with a gas-tight gate-valve, and an unloading chamber which is connected to the reaction chamber with another gas-tight gate-valve, the loading chamber and the unloading chamber being disposed across from each other in opposite sides of the vertical reaction chamber.

Therein, the wafers or substrates to be CVD-treated are firstly loaded in the loading chamber. Then, by temporarily opening the first gas-tight gate-valve, the object wafers or substrates are laterally transferred so as to be loaded into the boat in the heated reaction chamber. After completion of the CVD reaction, deposited wafers or substrates are laterally transferred from the boat of the reaction chamber to the unloading chamber by temporarily opening the second gas-tight gate-valve.

In the above-mentioned conventional CVD apparatus, the loading chamber, the reaction chamber and the unloading chamber are disposed in a lateral linear row with the gas-tight gate-valve parts in-between, and therefore the overall lateral size of the system is considerably large.

OBJECT AND SUMMARY OF THE INVENTION

According to the present invention, in order to eliminate the above-mentioned conventional problem, the disposition of the loading chamber and the unloading chamber have been improved.

In order to achieve the above-mentioned purpose, the CVD apparatus in accordance with the present invention comprises:

a reaction chamber having an evacuation port connected to an evacuation means, a reaction gas inlet port connected to a reaction gas supply, a heater for heating objects in the reaction chamber, an auxiliary chamber connected in vertical continuity with the reaction chamber 1 and having an elevator for bringing up a boat for holding the object wafers to the reaction chamber and bring down the same to the auxiliary chamber.

a loading-unloading chamber for gas-tightly provisionally storing object wafers about to be loaded into the auxiliary chamber and object wafers after completion of chemical vapor deposition and being unloaded from the auxiliary chamber until taking out to ambient atmosphere, the loading-unloading chamber being connected to the auxiliary chamber with a gate and to an inert gas introducing means and having a loading part in one end for receiving the object wafers about to be loaded into the auxiliary chamber from an ambient atmosphere part, an unloading part in the other end for discharging the object wafers having been unloaded from the auxiliary chamber to another ambient atmosphere part and a loading/unloading part (center) for at one time provisionally storing the object wafers having been transferred from the loading part and to be transferred into the auxiliary chamber and at another time the object wafers having been transferred from the auxiliary chamber and to be transferred to the unloading part, the loading/unloading part being disposed in front of the auxiliary chamber, and the loading part, the loading/un-loading part and the unloading part being disposed on a line which is substantially perpendicular to a line connecting the center of the auxiliary chamber and the center of the loading/unloading part, and slide means for slidingly transferring two cassettes, each for carrying a plurality of wafers, between a loading position consisting of the loading part and the loading/unloading part and an unloading position consisting of the loading/unloading part and the unloading part.

It is enough to provide only one loading-unloading chamber 3 on one side of the reaction chamber, and thereby the necessary space for the present apparatus is small and is realized.

The number of necessary gate valves is only three, namely for the loading part loading/unloading part and unloading part; and the number of necessary transfer means is only three. Therefore a simple construction is realized, resulting in low cost.

Especially a simple oblong sliding bed having two cassettes, namely the loading cassette and unloading cassette can transfer the wafers in the direction thereof, thereby the above-mentioned three transfer means can be simplified.

The loading cassette and the unloading cassette have the configuration wherein wafers can be inserted from one side and taken out to the opposite side, and thereby the rotation of the cassette itself is not necessary. This results in simple construction of the apparatus.

While the novel features of the invention are set forth particularly in the appended claims, the invention, both as to organization and content, will be better understood and appreciated, along with other objects and features thereof, from the following detailed description taken in conjunction with the drawings.

Figure 1:
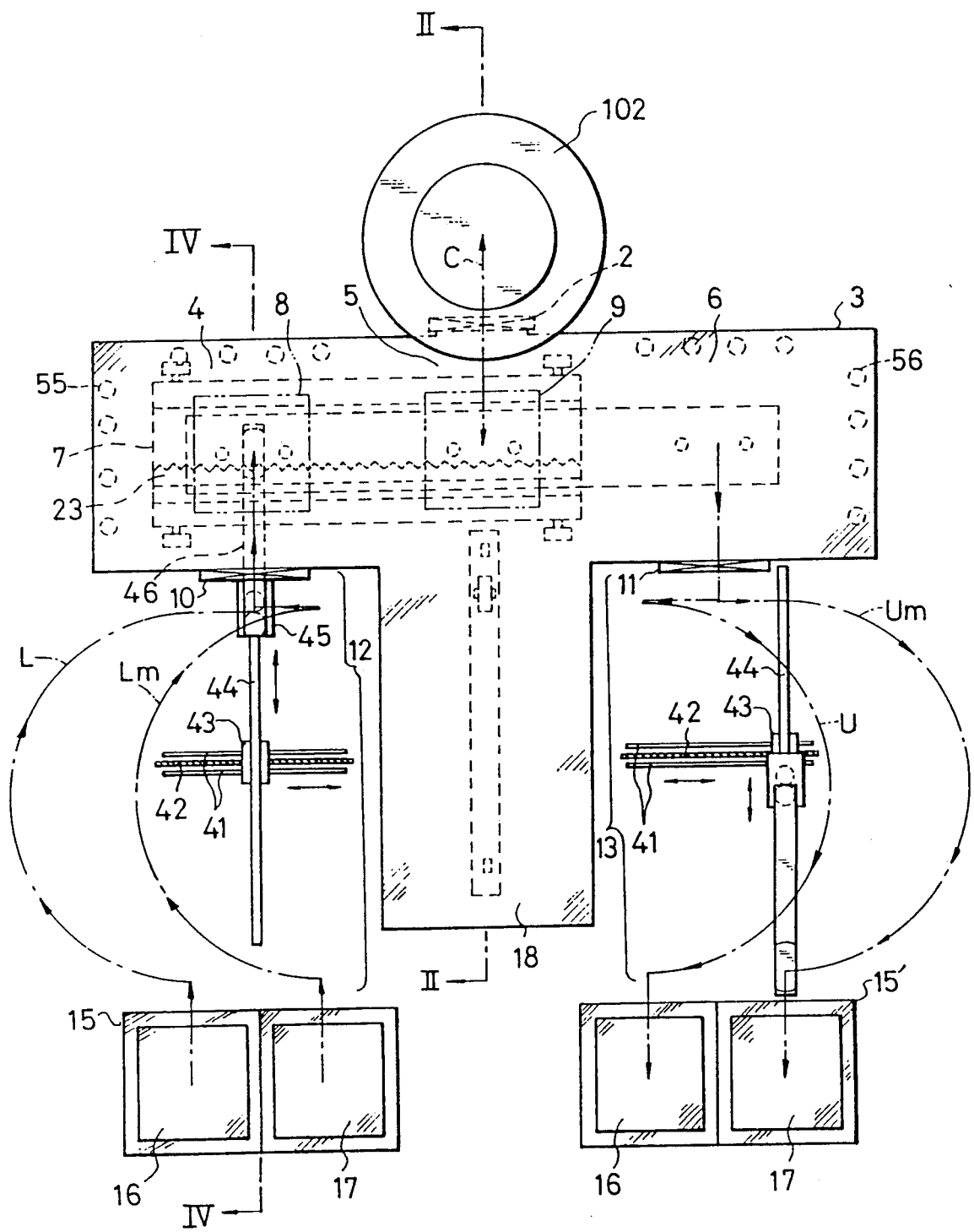
FIG. 1 shows a top plan view of a first embodiment of the present invention.

It will be recognized that some or all of the Figures are schematic representations for purposes of illustration and do not necessarily depict the actual relative sizes or locations of the elements shown.

DESCRIPTION OF THE PREFERRED EMBODIMENT

With reference to FIG. 1 through FIG. 8, a first embodiment of the CVD apparatus in accordance with the present invention is elucidated hereafter.

The CVD apparatus of the embodiment comprises a reaction chamber 102 of a vertical pipe type and an auxiliary chamber 103 which is also of the vertical pipe type of the same diameter with the reaction chamber 102 and connected under the reaction chamber 102, thereby to form a continuous vertical pipe. An evacuation pump (not shown) is connected through an evacuation valve 112 on the top lid 102' of the reaction chamber. Further a reaction gas inlet tube 115' is connected to the reaction chamber 102 through a reaction gas valve 115. The reaction chamber 102 further has a heater 111 such as coil heater 111 to heat CVD-treatment object to be located in it by infrared rays. The auxiliary chamber 103 is gas-tightly connected to a gas-tight tank 130 situated thereunder. A boat 113 for containing object wafers or substrates to be subject to CVD is mounted rotatably on a boat elevator 114 which is vertically driven by an elevator driving motor 134 contained in the gas-tight tank 130. The boat elevator 114 has a coaxial shaft 144 therein for driving the boat 113 to rotate in the reaction chamber 102 for uniform CVD operation. The coaxial rotating shaft 144 is driven through detachable gears 136, 137 by a boat rotating motor 135 contained in the gas-tight tank 130. The detachable gears 136 and 137 couple only when the boat elevator 114 is elevated. A loading-unloading chamber 3 is connected on a side of the auxiliary chamber 103 with a gas-tight gate-valve 2.

The loading-unloading chamber 3 has a $N_2$ gas supply tube 107' connected through a $N_2$ valve (not shown), and also an evacuation pipe (not shown) is connected thereto through an evacuation valve 108 (not shown) for realizing reduced pressure.

The loading-unloading chamber 3 comprises three parts. First, a center part serves as loading/unloading part 5 for wafers to the reacting chamber 102 (auxiliary chamber 103). A second part located in one end serves as a loading part 4 for wafers to be subsequently CVD-treated. A third part located in the end not containing the second part is to serve as an unloading part 6 for wafers having finished the CVD-treatment. The three parts are located on a straight line with even intervals from each other. A sliding bed 7 which can move and move back between a first position and a second position is set in the loading-unloading chamber 3. The first position is that wherein one end of the sliding bed 7 is on the loading part 4 and another end of it is on the loading/unloading part 5 as shown by a solid line in FIG. 3. In the second position the end of the sliding bed 7 comes to the loading/unloading part 5 (center part) and the other end comes to the unloading part 6 as shown by broken line in FIG. 3. The sliding bed 7 has a loading cassette 8 that is only for loading by carrying a plurality of wafers to be subsequently CVD-treated therein on one end thereof and unloading cassette 9 which is only for unloading by carrying a plurality of wafers having finished the CVD-treatment therein on another end thereof. Therein the cassettes are removably attached thereon only to be positioned.

On the opposite wall of the loading-unloading chamber 3 to that facing the reaction chamber 102, a gate valve 10 for inserting the wafers is provided to the loading part 4, and another gate valve 11 for unloading wafers is also provided to the unloading part 6. In front of the gate valve 10, a load cassette table 15 is positioned for supporting cassettes, disposed with a transferring device 12 therebetween. The load cassette table 15 receives both a product wafer cassette 16 and a monitor wafer cassette 17 disposed side by side thereon. The load cassette table 15 moves perpendicularly serving as an elevator for the cassettes 16, 17. Similarly in front of the gate valve 11, an unload cassette table 15', is positioned for supporting cassettes, disposed with a transferring device 13 therebetween. The unload cassette table 15' receives both a product wafer cassette 16' and a monitor wafer cassette 17' disposed side by side each other thereon. The unload cassette table 15' moves perpendicular serving as an elevator for the cassettes 16' and 17'. In front of the loading/unloading part 5, a transferring means 18 for transferring wafers between the reaction chamber 102 (auxiliary chamber 103) and the loading/unloading part 5 through the gate valve 2 is provided in the loading-unloading chamber 3.

An elevator means 19 for ascending and descending with both the loading cassette 8 and the unloading cassette 9 on the sliding bed 7 apart from the latter is provided in the loading-unloading chamber 3, wherever the sliding bed 7 is located at either of the above-mentioned first position or second position.

Figure 2:
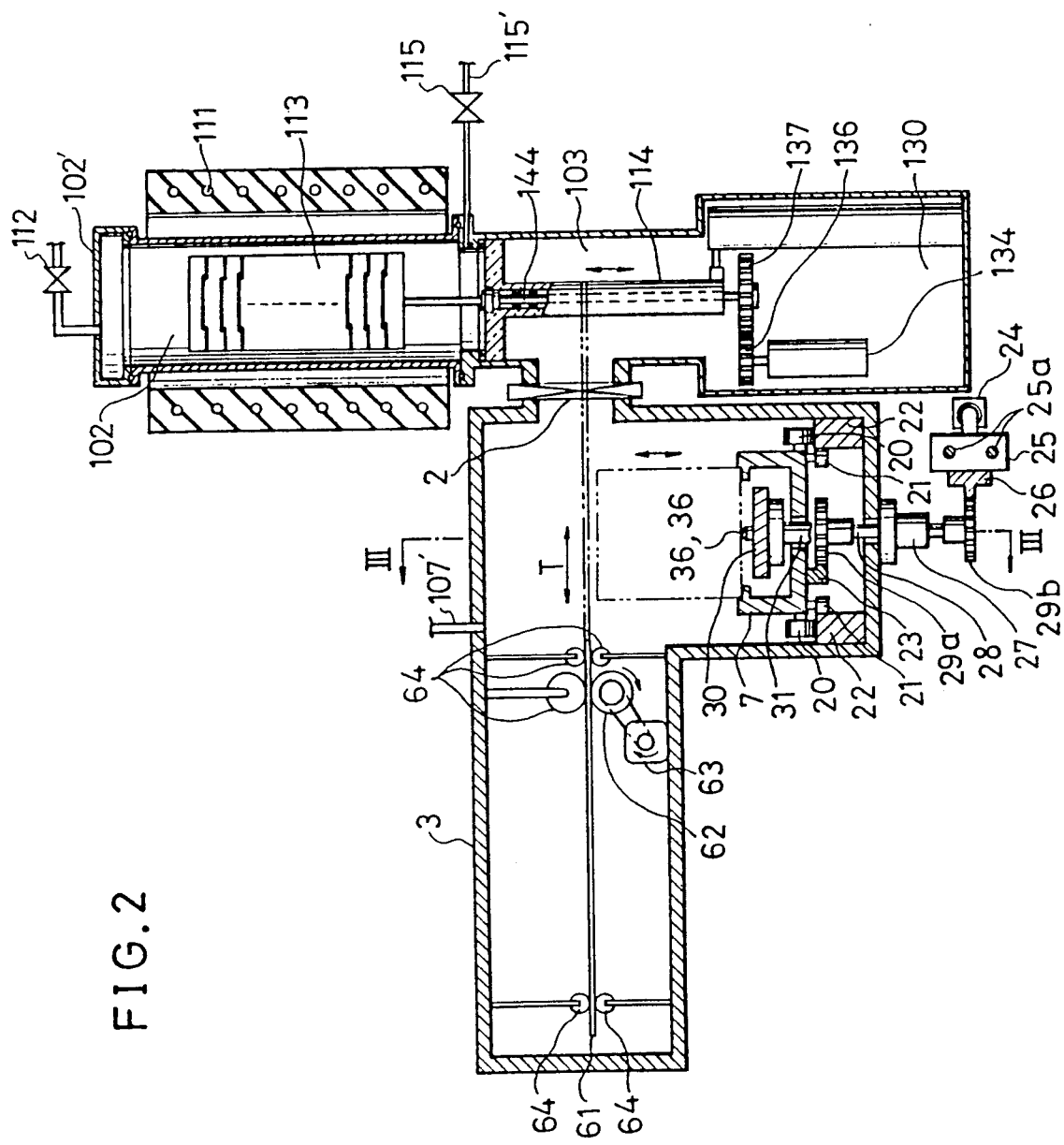
FIG. 2 shows a cross-sectional view taken on line II—II of FIG. 1.
Figure 3:
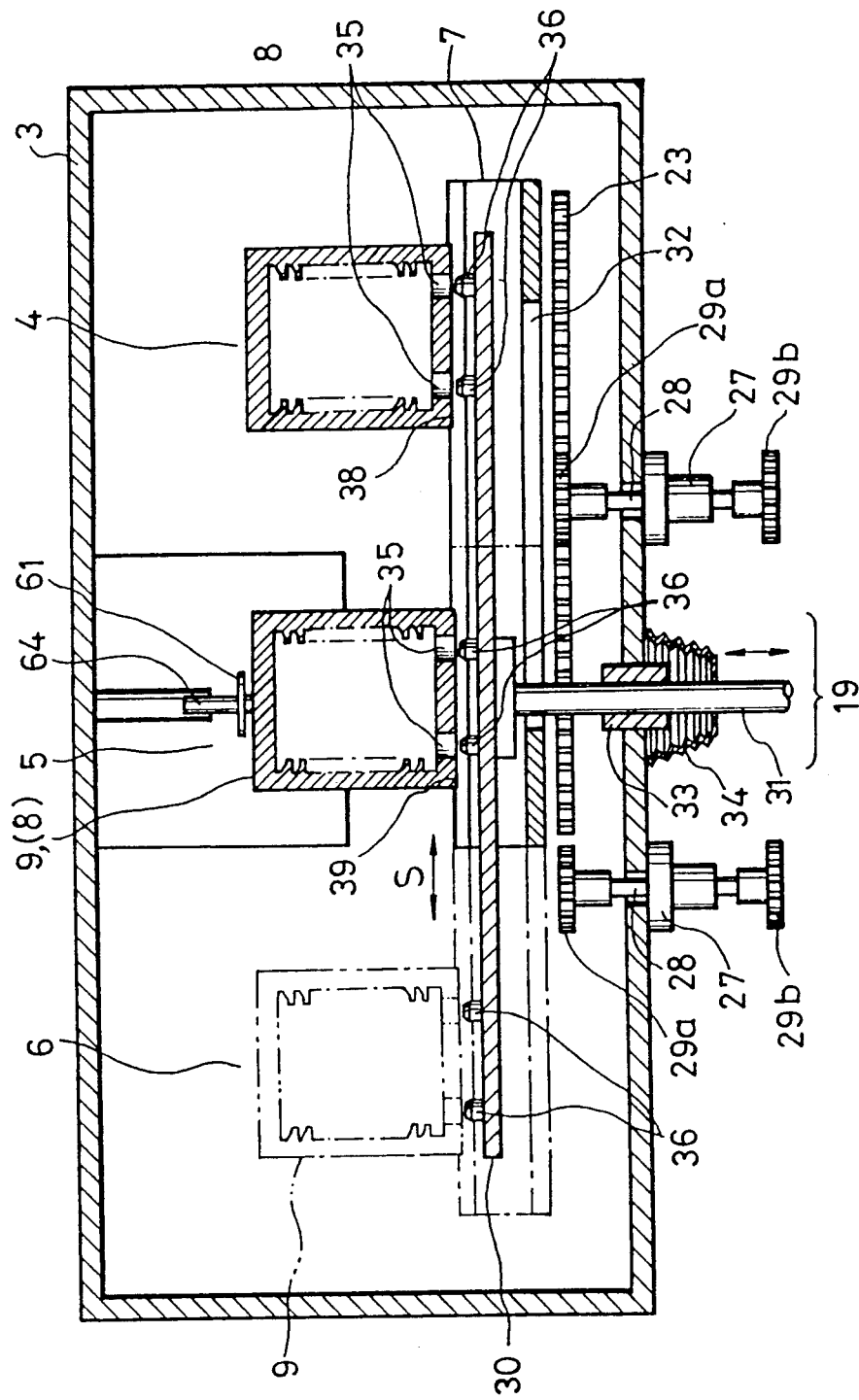
FIG. 3 shows a cross-sectional view taken on line III—III of FIG. 2.
Figure 4:
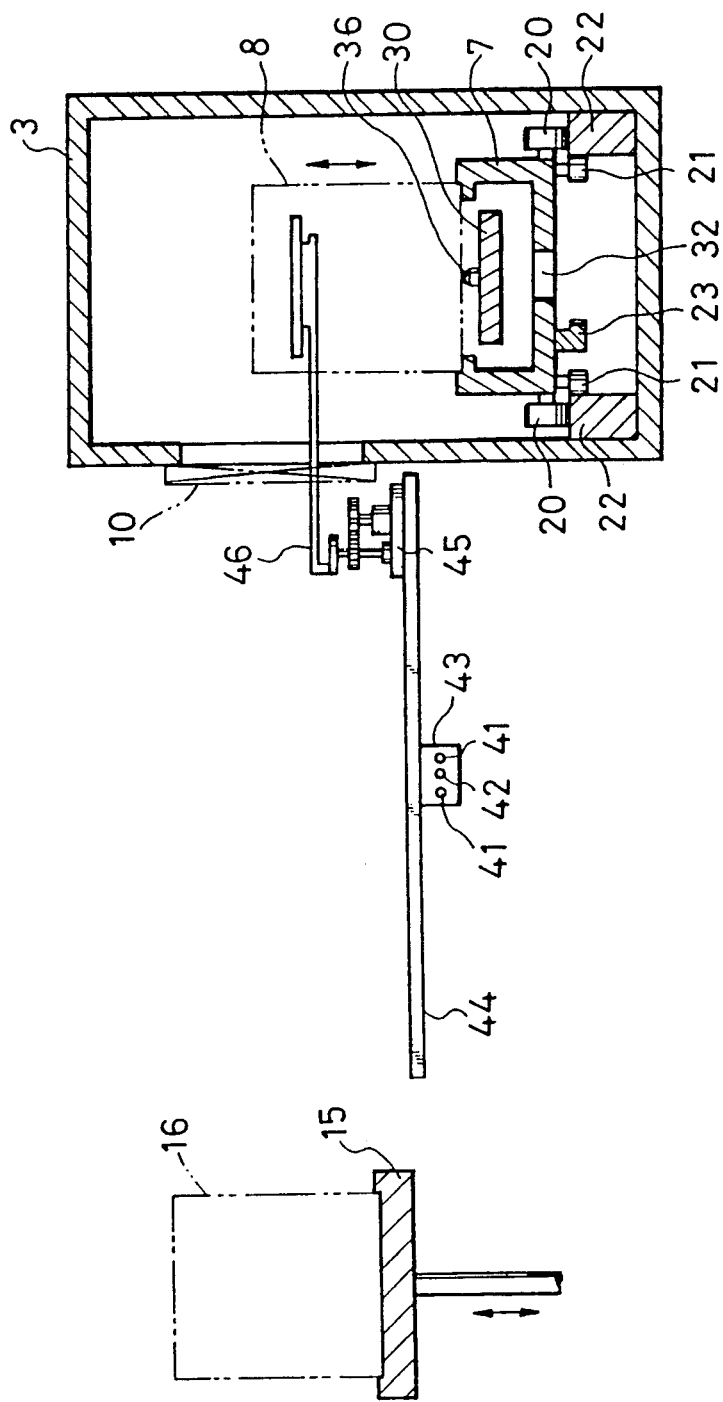
FIG. 4 shows a cross-sectional view taken on line IV—IV of FIG. 1.
Figure 5:
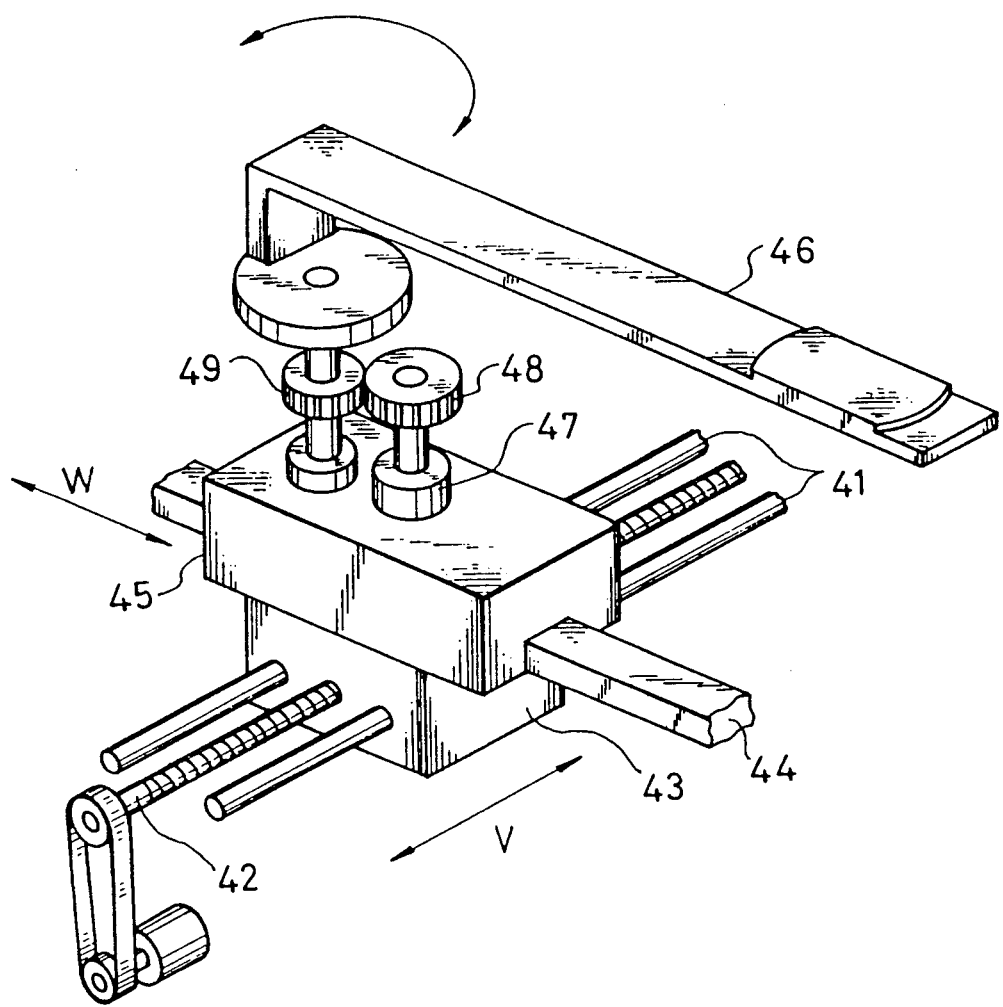
FIG. 5 shows a perspective view of a transferring means having a carry arm used in the present invention.

The sliding bed 7 can slide along a pair of rails 22 being supported thereon through supporting rollers 20 and guide rollers 21 on the rails shown in FIG. 2 and FIG. 4. The bottom surface of the sliding bed 7 has a rack 23 thereon (FIG. 2). A sliding body 25 (FIG. 2) having a rack 26 along which sliding body 25 slides on guides 25a, is driven by a cylinder mechanism 24 provided on the under surface of the loading-unloading chamber 3. Pinion gears 29a, 29a and pinion gears 29b, 29b are fixed at each end of rotating shafts 28, 28. Shafts 28, 28 hermetically penetrate the bottom wall of the loading-unloading chamber 3 through bearing/sealing parts 27, 27. Thus the move of the sliding body 25 is transformed through the pinion gears 29b, 29b and 29a, 29a, to the rack 23. So the sliding bed 7 is driven in the direction of arrow S (in FIG. 3) by the cylinder mechanism 24.

The sliding bed 7 has a C-channel-like sectional shape. An ascending/descending board 30 is provided in the C channel which is a part of the elevator means 19. The central part of the ascending/descending board 30 is connected to one end of an ascending/descending shaft 31 penetrating both the sliding bed 7 and the bottom wall of the loading-unloading chamber 3. The ascending/descending shaft 31 is moved up or put down by a cylindrical mechanism (not shown in FIG. 3). Numeral 32 designates a long(slotted) hole cut through the sliding bed 7 for penetration by the ascending/descending shafts 31. Numeral 33 designates a slide bearing mounted on the bottom surface of the loading-unloading chamber 3. Numeral 34 is a known hermetic seal member such as diaphragm.

A pair of projections 36, 36 for inserting holes 35, 35 formed on the bottom surface of the loading cassette 8 and the unloading cassette 9 are provided on the upper surface of the ascending/descending board 30 at corresponding three parts such as the loading part 4, the loading/unloading part 5 and the unloading part 6. Recesses 38, 39 for inserting the bottom of the loading cassette 8 and the unloading cassette 9 are formed on the surface of the sliding bed 7 in order to fix the location thereof.

The transferring means 12 (FIG. 1) can take out wafers from either the product wafer cassette 16 or the monitor wafer cassette 17. Since the transferring means 12 comprises a moving body 43 (FIG. 5) having screw driven mechanism 42 and guides 41, 41 which can move on both sides as shown in the direction of arrow V (in FIGS. 1 and 5) with guide 44 fixed thereon and a moving block 45 can slide between the loading part and the loading cassette table 15 on guide 44 as shown in the direction of W (in FIGS. 1 and 5). The moving block 45 has a carry arm 46 which is rotated freely, gears 48, 49 and a motor 47 which drives the carry arm 46 together with gears 48, 49.

The transferring means 13 (FIG. 1) is configurated quite similarly.

Figure 6:
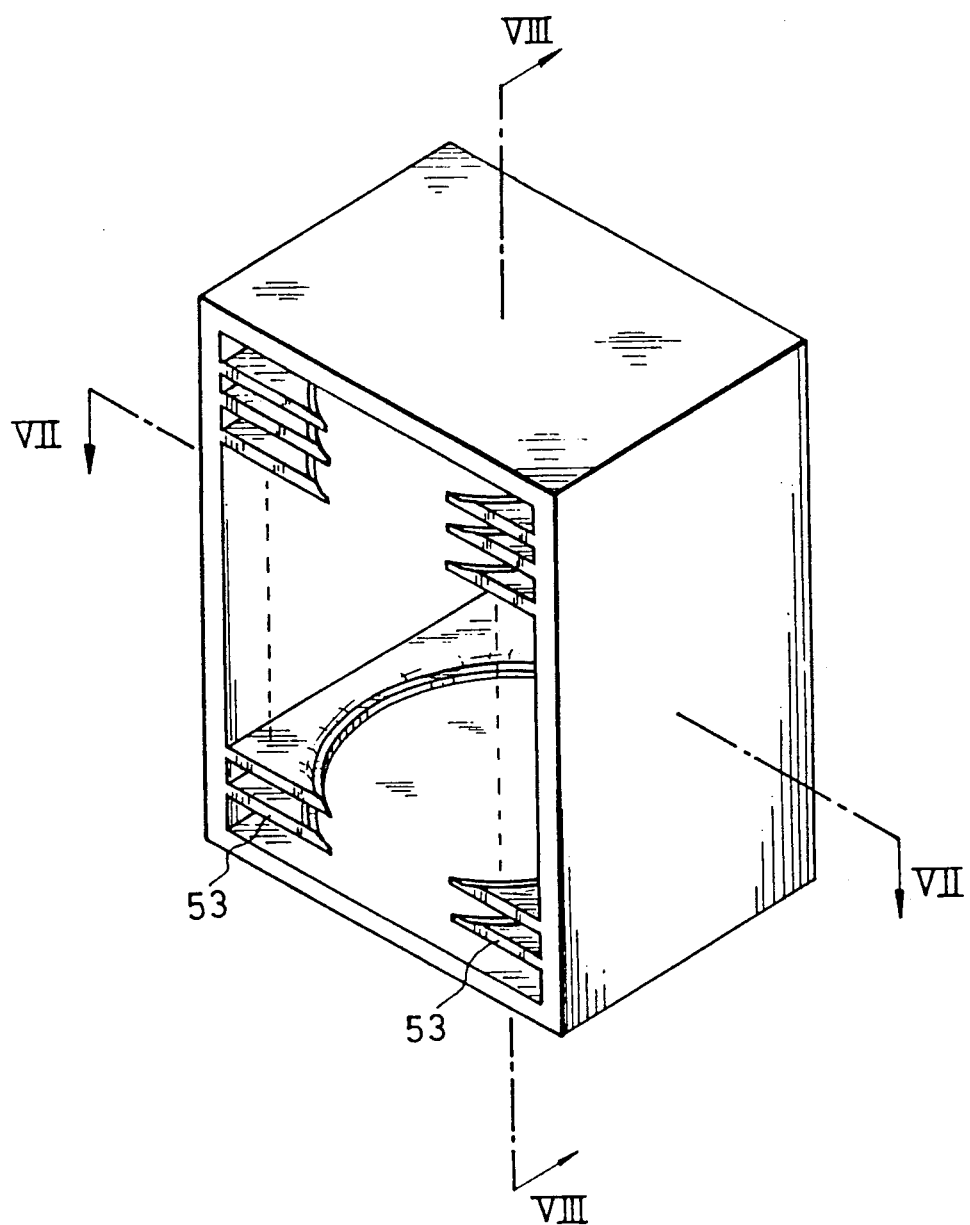
FIG. 6 shows a perspective view of a cassette used in the present invention.
Figure 7:
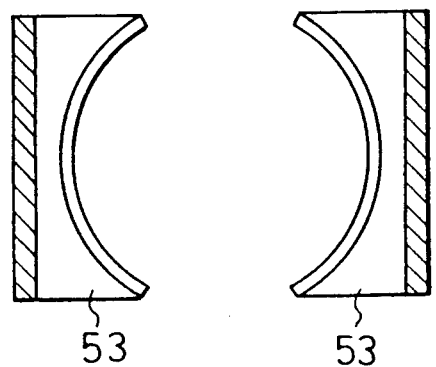
FIG. 7 shows a cross-sectional view taken on line VII—VII of FIG. 6.
Figure 8:
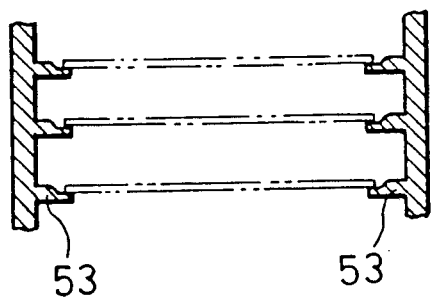
FIG. 8 shows a cross-sectional view taken on line VIII—VIII of FIG. 6.

The loading cassette 8 and the unloading cassette 9 have the same configuration as shown in FIGS. 6, 7 and 8. Each cassette has a box-shaped frame, wherein a pair of opposing side faces are open in order to insert a wafer from one side and to take out through opposite side. A plurality of pairs of inward projections 53 are provided having a given interval between adjacent pairs for receiving wafers horizontally with gaps inside the walls of the frame. Each of the plurality of projections 53 are formed in arched decent shape so that the side edge of a wafer is removably received thereon. The number of steps of the pair of projections 53 is larger than that of the product wafer cassette 16 (usual 25 steps) by 2-3 steps.

A pre-heating heater 55 for preliminary heating of wafers, such an infrared heater, is provided in the loading part 4 of the loading-unloading chamber. A cooler 56 such as refrigerant-circulating tubes for cooling hot wafers having finished the CVD-treatment is provided in the unloading part 6.

The loading cassette 8 is made of synthetic resin which endures temperature of the above-mentioned pre-heating. And the unloading cassette 9 is made of a heat resistant and heat conductive material such as aluminum for enabling containing of hot wafers from the reaction chamber 102 having finished the CVD-treatment immediately. The surface of the unloading cassette 9 is treated for superior lubrication with a nickel-phosphorous layer impregnated with tetrafluoroethylene called "LUBRIC" (registered trademark, by MITSUBISHI METAL CORPORATION) for the aim of preventing production of scratches on wafers, and the result of not producing dust due to scratches. The loading cassette 8 may also be made of the same material in some case, depending on the temperature of pre-heating.

The transferring means 18 comprises a sliding arm 61 which carries a wafer thereon one by one from the loading/unloading part 5 to the boat 113 in the reaction chamber 102 (auxiliary chamber 103). The sliding arm carries back wafers thereon one by one from the boat 113 to the loading/unloading part 5. Such carryings of the wafers are made by slidings on guide rollers 64 of the sliding arms by a roller 62 driven by a motor 63. So the sliding arm 61 is driven in the direction of arrow T (in FIG. 2).

Operation of the above-mentioned embodiment apparatus is as follows:

First, $N_2$ gas is supplied in the loading-unloading chamber 3 adjusting to the atmospheric pressure, at the condition that the sliding bed 7 is in the first position as shown by solid line in FIG. 3. After opening of the gate valve 10, the transferring device 12 transfers a wafer in the product wafer cassette 16 on the load cassette table 15 into the loading cassette 8, in a step by step process. During such transfer steps a few monitor wafers, which are for checking thickness of CVD film (layer) and stored in the monitor wafer cassette 17, are transferred into the loading cassette 8. In that case, since the loading cassette 8 can store many more wafers than the product wafer cassette 16, the necessary number of product wafers plus monitor wafers can be stored in the loading cassette 8. This enables monitoring of the thickness of CVD layer without reducing the productivity.

The above-mentioned transferring is elucidated more in detail hereafter. For example, a product wafer in the product wafer cassette 16 is transferred to the loading cassette 8 as follows: The carry arm 46 is inserted into the product cassette 16 at the part just under the objective product wafer. The product wafer cassette 16 is put down in accordance with the descending motion of the load cassette table 15. So the objective product wafer is supported on the carry arm 46, which is drawn for the product wafer cassette 16. Then, the carry arm 46 is turned around toward the loading part 4. The carry arm 46 having the wafer thereon is inserted into loading cassette 8 in accordance with the sliding motion of the block 45 along the guide 44. The ascending/descending board 30 in the sliding bed 7 is put up, and accordingly, the loading cassette 8 thereon is put up, and results in supporting of the wafer on one of the plurality of projections 53. Then, the carry arm 46 is drawn back from the loading cassette 8. In the later the above-mentioned sequential motions are repeated one by one, in order to transfer the necessary number of wafers. The above-mentioned repeated sequential motions are made similarly in transferring wafers between the loading/unloading part 5 with the boat 113 in the reaction chamber 102 (auxiliary chamber 103) and in transferring wafers from the unloading part 6 to the product wafer cassette 16' or to the monitor wafer cassette 17', therefore, elucidations on these motions are shortened hereafter.

When the above-mentioned transferring of wafers to the loading cassette 8 is finished, the gate valve 10 is closed. The loading-unloading chamber 3 is evacuated to about $10^{-3}$ torr of pressure. While the sliding bed 7 is kept at the first position to await the completion of the CVD-treatment of the foregoing wafers in the reaction chamber 1, wafers in the loading cassette 8 are pre-heated by the pre-heater 55, to completely dry undesirable humidity thereon, and this pre-heating shortens the heating period in the reaction chamber.

When the foregoing CVD-treatment is finished, the foregoing wafers, having finished the CVD-treatment, are transferred to the unloading cassette 9 by the transferring means 13. Next the sliding bed 7 comes to the second position as shown by broken line in FIG. 3. The wafers in the loading cassette 8 at the loading/unloading part 5 are transferred on the boat 113 in the auxiliary chamber 103. Then, after closing the gate-valve 2, the boat 113 mounted on the boat elevator 114 is elevated to the midway position of the reaction chamber 102, and boat containing the wafers is heated in CVD-treatment at 600°-800° C. during a 30-100 minute interval.

The foregoing wafers, having finished the CVD-treatment and having been transferred in the unloading cassette 9 on the sliding bed 7 come to the unloading portion 6, and are cooled by the cooler 56. After being cooled completely so as not to be oxidized in the ambient atmosphere, $N_2$ gas is supplied in the loading-unloading chamber 3 adjusting to the atmospheric pressure. After the gate valve 11 is opened, the product wafer(s) of the foregoing wafers are transferred into the product wafer cassette 16, and the monitor wafer(s) are transferred into the monitor wafer cassette 17' by the transferring means 13. Then, the gate valve 11 is closed, and the sliding bed 7 having empty cassette cases 8, 9 thereon comes back to the first position, and the above-mentioned sequential transferring of wafers, CVD-treatment, and so on are repeated.

Chain lines L, Lm, U, Um and C in FIG. 1 show loci of transfer motions of wafers in loading of product wafers, loading of monitor wafers, unloading of product wafers, unloading of monitor wafers and carry/carry-back of wafers, respectively.

Although the invention has been described in its preferred form with a certain degree of particularity, it is understood that the present disclosure of the preferred form has been changed in the details of construction and the combination and arrangement of parts may be altered without departing from the spirit and the scope of the invention as hereinafter claimed.

What is claimed is:

1. A CVD apparatus comprising:
    a reaction chamber including an evacuation port connected to an evacuation means, a reaction gas inlet port connected to a reaction gas supply, and a heater for heating object wafers within said reaction chamber,
    an auxiliary chamber vertically connected with said reaction chamber, said auxiliary chamber having an elevator for bringing up a boat, for holding said object wafers, to said reaction chamber and bringing down the boat to said auxiliary chamber,
    a loading-unloading chamber for gas-tightly and provisionally storing object wafers before being loaded into said auxiliary chamber, after being unloaded from said auxiliary chamber following completion of chemical vapor deposition, and before being taken out to ambient atmosphere, said loading-unloading chamber being connected to said auxiliary chamber with a gate valve and to an inert gas introducing means, said loading-unloading chamber having a loading part in a first end for receiving said object wafers from an ambient atmosphere part and loading said object wafers into said auxiliary chamber, an unloading part in a second end for receiving said object wafers from the auxiliary chamber and discharging said object wafers to another ambient atmosphere part, and a loading/unloading part at a center position between said first and second ends for at one time provisionally storing said object wafers having been transferred from said loading part and to be transferred into said auxiliary chamber, and at another time provisionally storing said object wafers having been transferred from said auxiliary chamber and to be transferred to said unloading part, said loading/unloading part being disposed in front of said auxiliary chamber, with said loading part, said loading/unloading part and said unloading part being disposed on a line which is substantially perpendicular to a line connecting the center of said auxiliary chamber and the center of said loading/unloading part, and
    slide means for slidingly transferring two cassettes, each for carrying a plurality of wafers, between a loading position consisting of said loading part and said loading/unloading part and an unloading position consisting of said loading/unloading part and said unloading part.

2. A CVD apparatus in accordance with claim 1, wherein
    said slide means has an elevator for raising/lowering said cassettes.

3. A CVD apparatus in accordance with claim 1 or 2, wherein
    said two cassettes consists of a first cassette assigned only for loading and a second cassette assigned only for unloading,
    each said cassette comprises a frame having a pair of openings in opposite sides of said cassette for inserting and withdrawing said wafers.

4. A CVD apparatus in accordance with claim 3, wherein
    one said cassette for loading and said cassette for unloading have a containment capacity of wafers numbering more than a product wafer cassette located outside said loading-unloading chamber and containing product wafers.

5. A CVD apparatus in accordance with claim 3, wherein
    said cassette for unloading is made of heat resistant material, and at least holding parts of said cassette for holding wafers thereon have lubricated surfaces.

6. A CVD apparatus as claimed in claim 1, further comprising:
    a load cassette table into which a transferring means inserts wafer cassettes, in a manner to face said loading part, and
    an unload cassette table into which a transferring means inserts wafer cassettes, in a manner to face said unloading part.

7. A CVD apparatus in accordance with claim 6, wherein
each of said load cassette table and said unload cassette table has a product wafer cassette and a monitor wafer cassette side by side thereon.

8. A CVD apparatus in accordance with claim 1, wherein
a pre-heating means is provided at said loading part.

9. A CVD apparatus in accordance with claim 1 wherein
a cooling means is provided at said unloading part.

10. A CVD apparatus in accordance with claim 4, wherein
said cassette for unloading is made of heat resistant material, and at least holding parts of said cassette for holding wafers thereon have lubricated surfaces.

11. A CVD apparatus in accordance with claim 4, further comprising:
a load cassette table into which a transferring means inserts wafer cassettes, in a manner to face said loading part, and
an unload cassette table into which a transferring means inserts wafer cassettes, in a manner to face said unloading part.

12. A CVD apparatus in accordance with claim 11, wherein
each of said load cassette table and said unload cassette table has a product wafer cassette and a monitor wafer cassette side by side thereon.

* * * * *